(12) United States Patent
Pinter

(10) Patent No.: US 10,591,721 B2
(45) Date of Patent: Mar. 17, 2020

(54) METHOD FOR MANUFACTURING A PROTECTIVE WAFER INCLUDING INCLINED OPTICAL WINDOWS AND DEVICE

(71) Applicant: Robert Bosch GmbH, Stuttgart (DE)

(72) Inventor: Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 190 days.

(21) Appl. No.: 15/790,244

(22) Filed: Oct. 23, 2017

(65) Prior Publication Data

US 2018/0113300 A1    Apr. 26, 2018

(30) Foreign Application Priority Data

Oct. 26, 2016   (DE) .................. 10 2016 221 038

(51) Int. Cl.
| | |
|---|---|
| *B81C 1/00* | (2006.01) |
| *G02B 27/00* | (2006.01) |
| *B81B 7/00* | (2006.01) |
| *G02B 26/08* | (2006.01) |

(52) U.S. Cl.
CPC ........ *G02B 27/0006* (2013.01); *B81B 7/0067* (2013.01); *B81C 1/00317* (2013.01); *B81C 1/00626* (2013.01); *G02B 26/0833* (2013.01); *B81B 2201/042* (2013.01); *B81B 2203/0163* (2013.01); *B81B 2203/0384* (2013.01); *B81C 2203/035* (2013.01); *B81C 2203/037* (2013.01)

(58) Field of Classification Search
None
See application file for complete search history.

(56) References Cited

U.S. PATENT DOCUMENTS

| | | | |
|---|---|---|---|
| 9,505,614 B2 * | 11/2016 | Liu | .................. B81B 3/0078 |
| 9,745,188 B1 * | 8/2017 | Dehe | .................. B81B 3/0072 |
| 2007/0024549 A1 | 2/2007 | Choi et al. | |
| 2016/0187372 A1 * | 6/2016 | He | .................. G01P 15/125 |
| | | | 73/514.32 |
| 2017/0297898 A1 * | 10/2017 | Torkkeli | .................. B81B 3/007 |

FOREIGN PATENT DOCUMENTS

| | | |
|---|---|---|
| DE | 102010062118 A1 | 5/2012 |
| DE | 102012206858 A1 | 10/2013 |

* cited by examiner

*Primary Examiner* — Shamim Ahmed
(74) *Attorney, Agent, or Firm* — Norton Rose Fulbright US LLP; Gerard Messina

(57) ABSTRACT

A method for manufacturing a protective wafer including a frame wafer and an optical window, and to a method for manufacturing a micromechanical device including such a protective wafer having an inclined optical window. Also described are a protective wafer including a frame wafer and an optical window, and a micromechanical device including a MEMS wafer and such a protective wafer, which delimit a cavity, the protective wafer including an inclined optical window.

5 Claims, 3 Drawing Sheets

METHOD FOR MANUFACTURING A PROTECTIVE WAFER INCLUDING INCLINED OPTICAL WINDOWS AND DEVICE

CROSS REFERENCE

The present application claims the benefit under 35 U.S.C. § 119 of German Patent Application No. DE 102016221038.6 filed on Oct. 26, 2016, which is expressly incorporated herein by reference in its entirety.

BACKGROUND INFORMATION

The present invention relates to a method for manufacturing a protective wafer including a frame wafer and an optical window, and to a method for manufacturing a micromechanical device including such a protective wafer having an inclined optical window.

MEMS components must be protected against harmful outside environmental conditions, for example the penetration of particles and the like. A protection against mechanical contact or destruction and for enabling the separation from a wafer assembly into individual chips by sawing is also necessary. In many cases, the setting of a certain atmosphere (gas type and gas pressure; vacuum also) must be made possible with the aid of a hermetic encapsulation.

The encapsulation of MEMS components with the aid of a cap wafer, which has cavities and through-holes, in the wafer assembly is an established process. For this purpose, a cap wafer is aligned with the wafer including the MEMS structures and joined thereto. The joining may take place both with the aid of anodic bonding and direct bonding (joining agent-free joint between glass and silicon), via eutectic joining layers and via glass solders or adhesives. The MEMS component is usually situated under the cavities of the cap wafer, and the electrical bond pads for connecting the component to thin wires are accessible via the through-hole in the cap wafer.

For optical MEMS (MOEMS), such as for micromirrors, the above-described protection and additionally a transparent window having a high optical quality and, if necessary, also including special optical coatings, are necessary. In isolated instances, through-holes for the electrical connection are also implemented in the caps.

When optical beams pass through the transparent window, reflections are created at the interfaces. When the stationary reflections are in the scan range of the μmirror, their intensity exceeds that of the projected image and thus has an interfering effect. These interfering reflections may only be reduced in their intensity by an anti-reflection coating of the optical window. Since the mirror in general pivots or is deflected symmetrically around its rest position, the reflection is always in the scan range when the optical window is in parallel to the rest position of the mirror surface and the distance between the mirror plane and the optical window is small. This is frequently the case with MEMS. The only option to avoid the interference by the reflections is to guide them out of the scan range in that the optical window and the mirror surface (in rest position, i.e., in the non-deflected state) are not situated in parallel to one another. Two options exist for this: inclination of the optical window or inclination of the rest position of the mirror with respect to a main plane of the MEMS component. Both options are already known from publications and from patent specifications in various specific embodiments. Inclined windows for separated chips are known from EP 1688776 A1, for example.

Inclined windows or also other window shapes with which the reflections are avoidable are described for wafer level packaging in U.S. Patent Application Publication No. 2007/0024549. The three-dimensional surface structures (e.g., inclined windows) described in the latter patent specification are to be manufactured from a transparent material (glass or plastic material) in a wafer assembly. The methods with the aid of which the three-dimensional structures may be manufactured are either very expensive or do not result in the necessary optical quality. Wafers including corresponding three-dimensional structures are moreover problematic during processing (e.g., during wafer bonding) since the structures may be damaged in the process.

Other methods for manufacturing protective caps having inclined optical windows are described, for example, in the German Application Nos. DE 102010062118 A1 and DE 102012206858 A1. However, these methods are also still relatively expensive for high volume applications, or the optical windows have only a limited optical quality.

SUMMARY

The present invention relates to a method for manufacturing a protective wafer including a frame wafer and an optical window, including the steps:

A) providing a frame wafer having a front side and a rear side;

B) creating a through-opening from the front side to the rear side with the aid of etching;

C) etching first trenches into the frame wafer from the front side;

D) closing the through-opening with an optical window; and

E) etching second trenches into the frame wafer from the rear side, in such a way that the first trenches form an interdigital structure with the second trenches, whereby a meander-shaped spring structure is formed in the frame wafer, which surrounds the through-opening, the spring structure including a first spring area having a first spring length and a second spring area having a second spring length, the first spring length being greater than the second spring length.

Advantageously, the method creates a protective wafer including an optical window which is flexibly suspended and whose position is thus adjustable.

One advantageous embodiment of the method according to the present invention provides that, prior to step D, a first recess is created on the front side or also for a second recess to be created on the rear side of the frame wafer, in particular with the aid of KOH etching, and the through-opening is situated in the area of the first recess or also of the second recess. In this way, the through-opening may advantageously be created quickly and cost-effectively. Advantageously, in this way the optical window may also be situated recessed on the frame wafer, whereby the overall depth is kept low, and the optical window is protected against mechanical damage such as scratches.

One advantageous embodiment of the method according to the present invention provides that, in step D, the frame wafer in an edge area around the through-opening is peripherally provided with a glass solder, and the optical window is situated on the frame wafer with the aid of the glass solder.

One advantageous embodiment of the method according to the present invention provides that, in step D, the optical window is arranged on the frame wafer with the aid of flip chip technology.

The present invention also relates to a method for manufacturing a micromechanical device including a protective wafer manufactured according to the present invention having an inclined optical window, including the following steps:

F) joining the frame wafer to a MEMS wafer, a hermetically sealed cavity having an internal atmospheric pressure being formed, which is delimited at least by the spring structure and the optical window; and G) subjecting the micromechanical device to an external atmospheric pressure, which is different from the internal atmospheric pressure of the cavity, whereby the optical window is deflected out of a rest position in parallel to the MEMS wafer in such a way that the optical window is positioned at an incline with respect to the MEMS wafer in that the optical window is farther deflected relative to the MEMS wafer in the vicinity of the first spring area than in the vicinity of the second spring area.

The manufacturing method offers an option to create micromechanical devices including inclined optical windows to avoid interfering reflections.

The present invention also relates to a protective wafer including a frame wafer and an optical window, the optical window being situated in a through-opening of the frame wafer, the frame wafer including first trenches on a front side and second trenches on a rear side, which are situated as an interdigital structure and form a meander-shaped spring structure, which surrounds the through-opening, the spring structure including a first spring area having a first spring length and a second spring area having a second spring length, the first spring length being greater than the second spring length.

The present invention also relates to a micromechanical device including a MEMS wafer and such a protective wafer, which delimit a cavity, the protective wafer including an inclined optical window, the cavity having an internal atmospheric pressure which is different from the external atmospheric pressure of the cavity, the optical window being deflected out of a rest position in parallel to the MEMS wafer in such a way that the optical window is positioned at an incline with respect to the MEMS wafer in that the optical window is farther deflected in the vicinity of the first spring area than in the vicinity of the second spring area.

Advantageously, the present invention creates a cost-effective manufacturing method suitable for high volume series-production. The inclined optical windows may be manufactured with the aid of processes customary in MEMS and semiconductor technology. In particular with a recessed arrangement of the optical window on the frame wafer, it is possible to avoid scratches, particles and damage on the optical window during the further manufacture and during the later operation of the device.

DETAILED DESCRIPTION OF EXAMPLE EMBODIMENTS

The manufacturing method is described hereafter for a protective wafer including cavities, through-holes and a transparent inclined window in optical quality. The sequence of the manufacturing method is described here only by way of example and may also take place deviating therefrom. The method is described by way of example based on FIGS. 1a through 1f in a sectional view and based on FIG. 2 in a top view.

The micromechanical device according to the present invention includes a protective wafer 10 and a MEMS wafer 400. Protective wafer 10 is made up of a frame wafer 100 and optical windows 300. Frame wafer 100 is preferably made of silicon, and the optical windows 300 are made of glass having a thermal coefficient of expansion adapted to silicon.

Figure 1A:
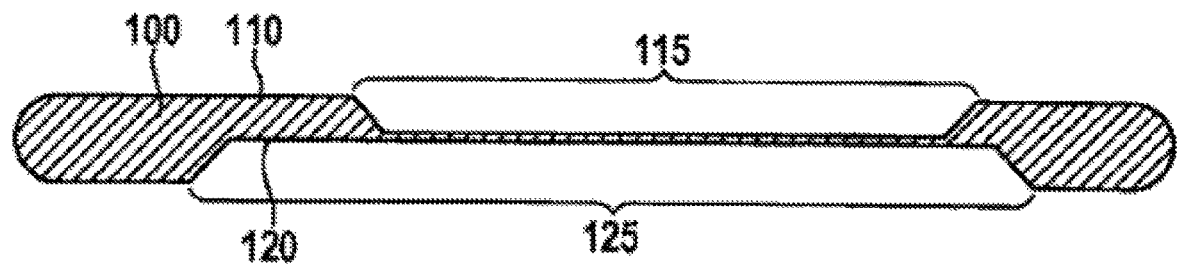
FIGS. 1 a-f show a method according to the present invention for manufacturing a micromechanical device including an inclined optical window based on cross-sectional views of a chip.
Figure 1B:
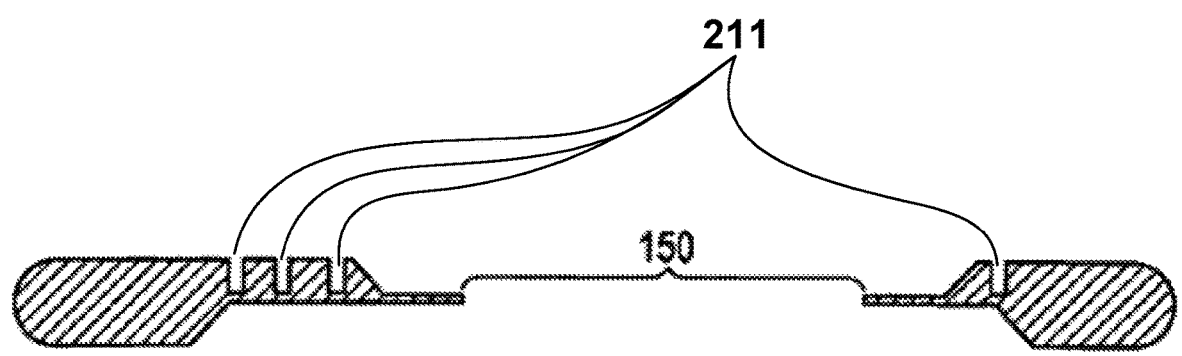
Figure 1C:
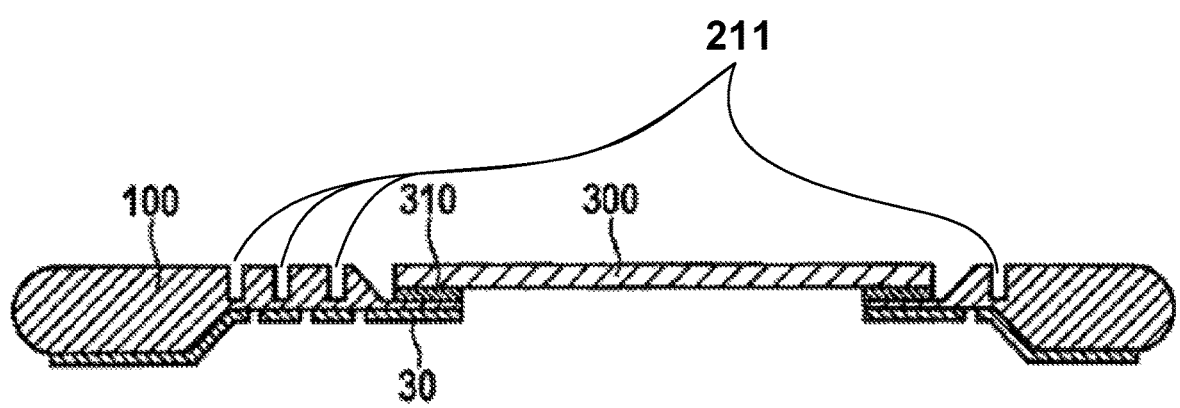

In a first step, depressions are introduced on front side 110 and on a rear side 120 of frame wafer 100, in particular with the aid of KOH etching (FIG. 1a). This is first recess 115 on front side 110, and second recess 125 on rear side 120. Thereafter, a through-opening 150 is introduced (FIG. 1b), over which optical window 300 is to be positioned. Through-opening 150 may be achieved by trench etching or also with the aid of KOH pre-etching of this area, prior to the two-sided KOH etching of the depression. First recess 115 on front side 110 is used to situate optical window 300 recessed with respect to the wafer surface of frame wafer 100. In this way, it is ensured that it is not possible to damage optical window 300 after the insertion. Scratches and the like due to mechanical action are thus avoided. In the same trench etching process step, first trenches 211 are circumferentially introduced around the area of optical window 300. On rear side 120, an etching mask 30 for rear-side second trenches 221 is applied (FIG. 1c). Second trenches 221 extend between first trenches 211 of front side 110 and form an interdigital structure with these. The trench depth on front side 110 and rear side 120 should be selected in such a way that laterally and vertically only a thin remaining thickness of the silicon remains. The front side and rear side trenches, in the cross section, result in a spring structure 200, a meander-shaped element which due to the thin silicon walls acts like a bellows (accordion). Bellows 200 may be both expanded in the wafer plane and be bent out of or into the wafer plane. The stiffness regarding the expansion and bending may be set via the number of the trenches and via the wall thickness of the silicon. The design of bellows 200 is to be implemented accordingly.

The insertion of optical windows 300, which previously were circumferentially provided with glass solder 310, takes place with the aid of flip chip technology even before the introduction of second trenches 221 (FIG. 1c).

After the insertion of optical windows 300, frame wafer 100 completely equipped with windows is heated on a heating plate, and when the softening temperature of glass solder 310 has been reached, window 300 is pressed onto the window frame of frame wafer 100 with the aid of a pressure difference between the front side and the rear side. Glass solder 310, which is present between glass window 300 and frame wafer 100, softens and thereby spreads. After cooling, a hermetic joint is thus established between glass window 300 and frame wafer 100. Inserting optical windows 300 even before the rear-side second trenches 221 are completed is advantageous to avoid or minimize a deflection of the bellows out of the wafer plane due to the applied pressure difference.

Figure 1D:
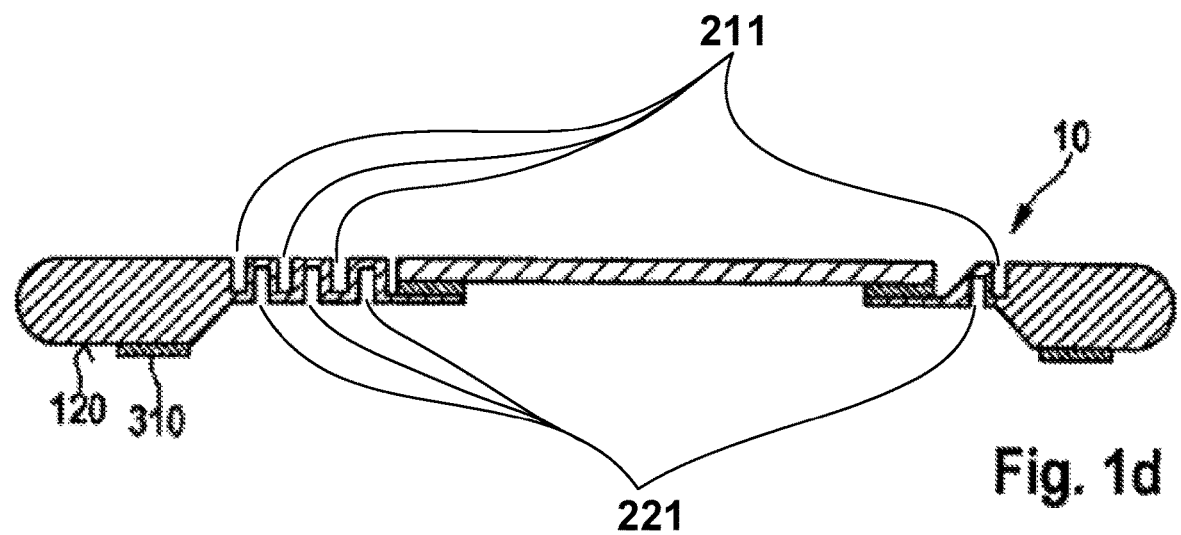
Figure 1E:
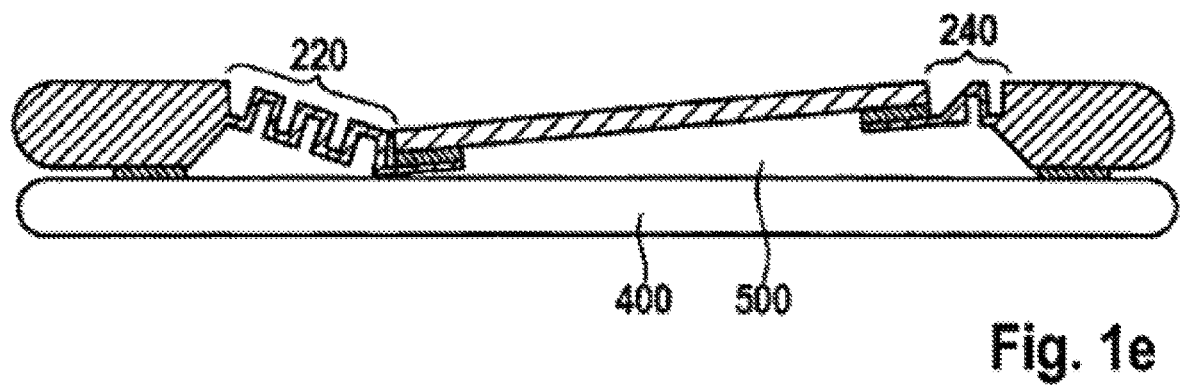

This is followed by the etching of second trenches 221 with the aid of the already completed mask 30 (FIG. 1d). Advantageously, the mask is made of oxide and thus does not have to be removed after the trench etching. As a result, protective wafer 10 is created.

For the creation of a hermetic bond of protective wafer 10 with a MEMS wafer 400, in particular an actuator or sensor wafer, a glass solder 310, for example, is applied to rear side 120 of frame wafer 100 (FIG. 1*d*).

Figure 1F:
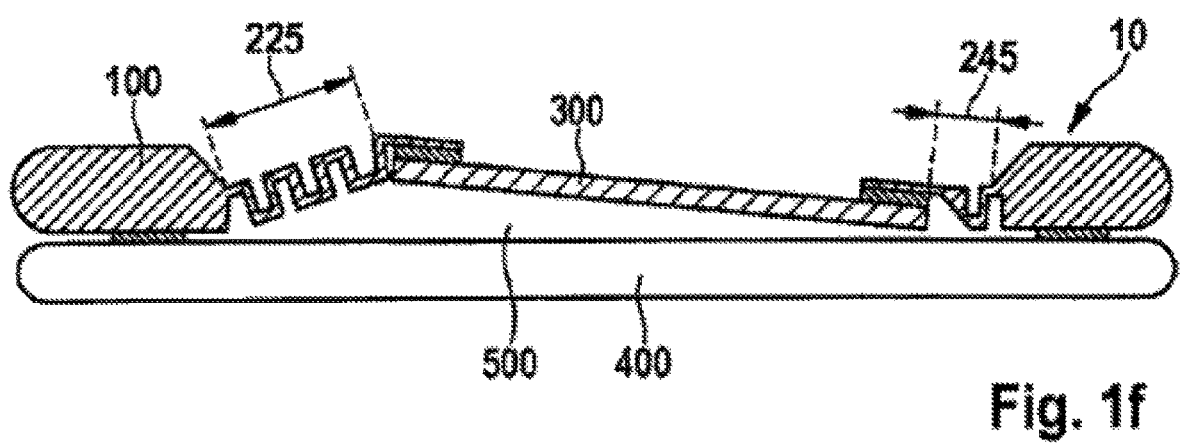

The creation of the wafer assembly is best carried out using MEMS-customary wafer assembly processes and equipment. An underpressure (up to a vacuum) or an overpressure with respect to the outside world may be set in cavities 500 between frame wafer 100 and MEMS wafer 400. This pressure difference achieves a resulting force on optical window 300 and thus a deflection of the resilient elements of spring structure 200. An underpressure (vacuum) in cavity 500 results in a deflection into the wafer plane (FIG. 1*e*), and an overpressure results in a deflection beyond the wafer plane (FIG. 1*f*).

Figure 2:
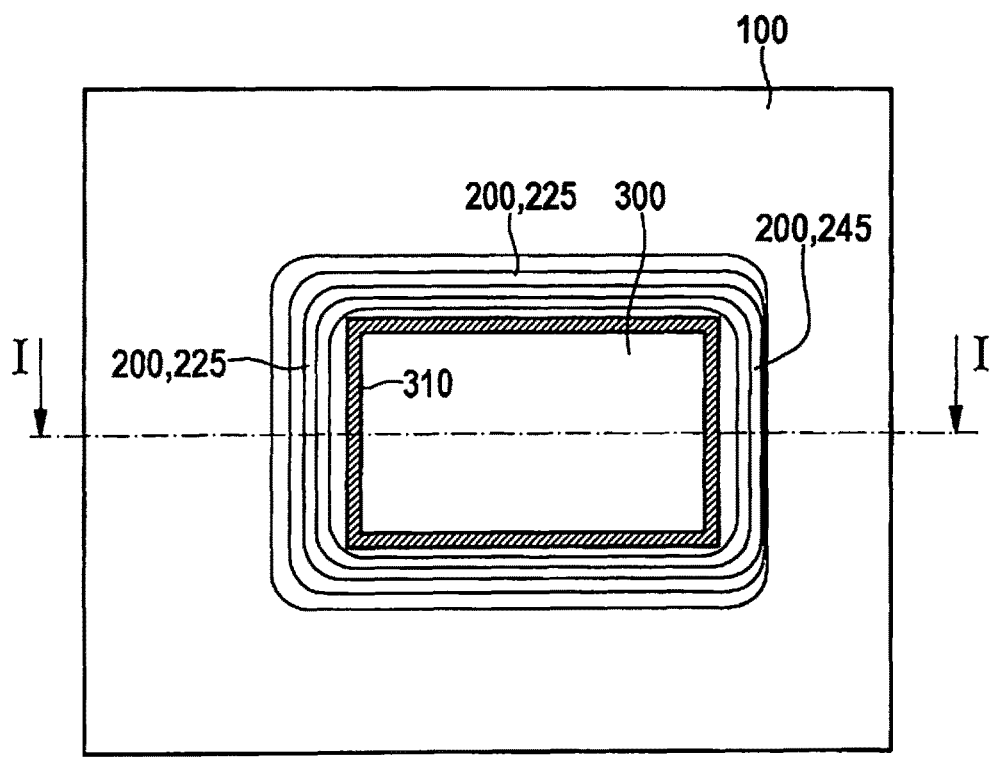
FIG. 2 shows a top view onto a detail of a micromechanical device according to the present invention in the form of a chip including an optical window and circumferential resilient elements having corresponding trenches.

To achieve a tilt of optical window 300, spring structure 200 is to be designed in such a way that a first spring area 220 is provided, for example on three sides of optical window 300, which is ensured a large first spring length 225 a low stiffness with respect to a movement out of the wafer plane. On the fourth window side, spring structure 200 is to be designed in such a way that such a movement preferably does not take place. Correspondingly, a second spring area 240 having a small second spring length 245 is situated here. On this side, however, bending should be possible in second spring area 240, which allows an inclined position of optical window 300. The tilt angle may essentially be set via the pressure difference, i.e., the difference between the internal atmospheric pressure in cavity 500 and the external atmospheric pressure, the stiffnesses and spring lengths of the bellows elements. FIG. 2 schematically shows such a design in a top view.

The tilting or inclined position of optical windows 300 is only provided when the pressure difference between cavity 500 and the outside world is preserved. The degree of the deflection of optical windows 300 may thus be used as a test criterion for the tightness of cavity 500.

In this way, the tightness test may be carried out both during the manufacturing processes and later during operation of the device. In the operating mode, the interfering, stationary reflection appears in the scan range of the micromirror if a component is not tight, and thus if an optical window is not inclined.

LIST OF REFERENCE NUMERALS

10 protective wafer
100 frame wafer
110 front side
115 first recess
120 rear side
125 second recess
150 through-opening
300 optical window
310 glass solder
30 rear-side etching mask
200 spring structure
211 first trenches
221 second trenches
220 first spring area
225 first spring length
240 second spring area
245 second spring length
400 MEMS wafer
500 cavity

What is claimed is:

1. A method for manufacturing a protective wafer including a frame wafer and an optical window, comprising:
    A) providing a frame wafer having a front side and a rear side;
    B) creating a through-opening from the front side to the rear side with the aid of etching;
    C) etching first trenches into the frame wafer from the front side;
    D) closing the through-opening with an optical window; and
    E) etching second trenches into the frame wafer from the rear side in such a way that the first trenches form an interdigital structure with the second trenches, whereby a meander-shaped spring structure is formed in the frame wafer, which surrounds the through-opening, the spring structure including a first spring area having a first spring length and a second spring area having a second spring length, the first spring length being greater than the second spring length.

2. The method for manufacturing a protective wafer as recited in claim 1, wherein, prior to step D, at least one of: (i) a first recess is created on the front side of the wafer with the aid of KOH etching, and (ii) a second recess is created on the rear side of the frame wafer with the aid of KOH etching, and wherein the through-opening is situated in an area of at least one of the first recess and the second recess.

3. The method for manufacturing a protective wafer as recited in claim 1, wherein, in step D, the frame wafer in an edge area around the through-opening is circumferentially provided with a glass solder, and the optical window is situated on the frame wafer with the aid of the glass solder.

4. The method for manufacturing a protective wafer as recited in claim 1, wherein, in step D, the optical window is arranged on the frame wafer with the aid of flip chip technology.

5. A method for manufacturing a micromechanical device including an inclined optical window, comprising:
    (A) providing a frame wafer having a front side and a rear side;
    B) creating a through-opening from the front side to the rear side with the aid of etching;
    C) etching first trenches into the frame wafer from the front side;
    D) closing the through-opening with an optical window;
    E) etching second trenches into the frame wafer from the rear side in such a way that the first trenches form an interdigital structure with the second trenches, whereby a meander-shaped spring structure is formed in the frame wafer, which surrounds the through-opening, the spring structure including a first spring area having a first spring length and a second spring area having a second spring length, the first spring length being greater than the second spring length;
    F) joining the frame wafer to a MEMS wafer, a hermetically sealed cavity having an internal atmospheric pressure being formed, which is delimited at least by the spring structure and the optical window; and
    G) subjecting the micromechanical device to an external atmospheric pressure, which is different from the internal atmospheric pressure of the cavity, whereby the optical window is deflected out of a rest position in parallel to the MEMS wafer in such a way that the optical window is positioned at an incline with respect to the MEMS wafer in that the optical window is farther deflected in the vicinity of the first spring area than in the vicinity of the second spring area.

* * * * *